(12) United States Patent
Wen

(10) Patent No.: US 8,227,049 B2
(45) Date of Patent: Jul. 24, 2012

(54) METHOD FOR FORMING PATTERNS BY VACUUM COATING

(76) Inventor: Paul Wen, Guangdong Province (CN)

( * ) Notice: Subject to any disclaimer, the term of this patent is extended or adjusted under 35 U.S.C. 154(b) by 572 days.

(21) Appl. No.: 12/348,017

(22) Filed: Jan. 2, 2009

(65) Prior Publication Data

US 2010/0157287 A1    Jun. 24, 2010

(30) Foreign Application Priority Data

Dec. 18, 2008  (CN) .......................... 2008 1 0183536

(51) Int. Cl.
  *C08J 7/18*  (2006.01)
  *B05D 7/22*  (2006.01)
  *C23C 16/00* (2006.01)
(52) U.S. Cl. .................. 427/555; 427/237; 427/250
(58) Field of Classification Search .............. 427/7, 532, 427/544, 485, 586, 596, 597, 145, 156, 165, 427/233, 236, 237, 238, 555; 216/64, 96, 216/97, 98, 102
See application file for complete search history.

(56) References Cited

U.S. PATENT DOCUMENTS

2005/0269740 A1 * 12/2005 Guns et al. .................... 264/259

FOREIGN PATENT DOCUMENTS

JP       3143605 U  *  7/2008

* cited by examiner

*Primary Examiner* — Dah-Wei Yuan
*Assistant Examiner* — Jose Hernandez-Diaz

(57) ABSTRACT

The invention discloses two kinds of methods for forming patterns by vacuum coating, one of which includes the following steps: (1) prepare a glass body; (2) pre-treat a part of an internal surface of the glass body where a pattern is to be formed thereon; (21) prepare a membrane with a hollowed-out pattern and adhere it on the glass body; (22) spray a wax layer evenly on the membrane and the surface of the glass body to cover the hollowed-out pattern; (23) remove the membrane; (3) perform vacuum coating to the glass body and form a coating layer on the surface of the glass body; (4) hollow out the pattern to be formed by removing the wax layer sprayed on the glass body by heating and thereby forming the pattern.

6 Claims, 1 Drawing Sheet

METHOD FOR FORMING PATTERNS BY VACUUM COATING

BACKGROUND OF THE INVENTION

The present invention pertains to artwork manufacturing technology and more particularly to a method for forming patterns by vacuum coating.

At present, the method for applying surface coating to plastic and glass products to form a desired surface pattern is as follows: first, applying surface coating to the entire surface area of the product; and then forming the desired surface pattern by means of printing, corrosion and so forth. For example, the Chinese patent application no. 200610170656.3 discloses a vacuum coating device for forming laser patterns on base material surface, and method and finished products thereof. The polycarbonate base material or the acrylic base material is put into the vacuum coating device; then silicon oxides and titanium oxides are evaporated onto the base material surface to form a coating layer; the obtained base material surface is disposed with a pattern layer by printing on the other side without the coating layer; and a color layer is disposed on the coating layer. For products obtained by said method, when the base material is irradiated by light beams, the coating layer refracts the light beams and thereby attaining a visual effect which shows various colors and refraction of light and shade. However, said method could not obtain hollowed-out patterns in a fast, precise and environmentally friendly manner.

In the present vacuum coating methods such as evaporating, sputtering, molecular beam epitaxy and so forth, the coating device usually uses a single and fixed coating source. However, such device can only process one product at a time. It is therefore low in processing efficiency and cannot satisfy the needs of massive production.

For the existing laser etching technology, generally etching starts right after importing the pattern data and calculating and adjusting the pattern data based on the product surface data, such as curvature, roughness and so forth. However, the pattern formed will suffer from deformation; the precision is low and the effect is poor.

For products obtained by means of existing technology, the coating layer is always on the external surface; while products which are coated on the internal surface thereof with a coating layer with hollowed-out pattern are not yet available.

BRIEF SUMMARY OF THE INVENTION

To overcome the deficiencies of the existing technology, one purpose of the invention is to provide a method for forming patterns by vacuum coating which is high in precision and capable of attaining good effect.

Another purpose of this invention is to provide a device for implementing the method of forming patterns by vacuum coating.

This invention is also intended to provide a product manufactured by the method of forming patterns by vacuum coating, which is a candle holder.

To achieve these objectives, the invention is detailed as below:

A method for forming patterns by vacuum coating, which adds the following step to existing pattern forming method by adhering membrane: pre-treat the internal surface of the glass body which will be subject to pattern forming by vacuum coating. The step comprises: spray a wax layer evenly on the membrane, then remove the membrane, and then perform vacuum coating to the glass body.

In the second method for forming patterns by vacuum coating, base on existing laser etching technology, the laser beam penetrates the external surface of the glass body and scan its internal surface, then melt or gasify the coating of the scanned part to expose the glass body, then forming patterns.

The said step also includes following steps:

set an extinction object or coating in the glass body in advance to stop the laser beam which penetrates the internal side of the glass body from projecting towards other parts, thereby avoiding imprints and damages which are not supposed to exist.

The coating layer is an aluminum plating layer with a thickness of 0.001-0.01 mm, which can meet the requirements of manufacture and have better artistic effect.

A special device for implementing the method for forming patterns by vacuum coating, which comprises a plurality of electric heating planes for coating respectively.

A product manufactured by the special device using the vacuum coating method being a candle holder in which there's at least one coating layer with a hollowed-out pattern on its internal surface. The coating layer is an aluminum plating layer with a thickness of 0.001-0.01 mm, which can ensure the artistic effect and protect the coating layer.

Advantages of this invention include: it is possible to form patterns on the coating layer directly by the two methods provided by this invention, and the obtained pattern is of high precision and good effect; the special device provided in this invention can perform coating operation to multiple products at one time, thus attaining high production efficiency; the products provided in this invention show good artistic effect and are durable, and the hollowed-out patterns have good 3D and simulation effect; the products are also not easy to be deformed or damaged.

The following is a more detailed description by means of the drawings and embodiments.

DETAILED DESCRIPTION OF THE INVENTION

Figure 2:
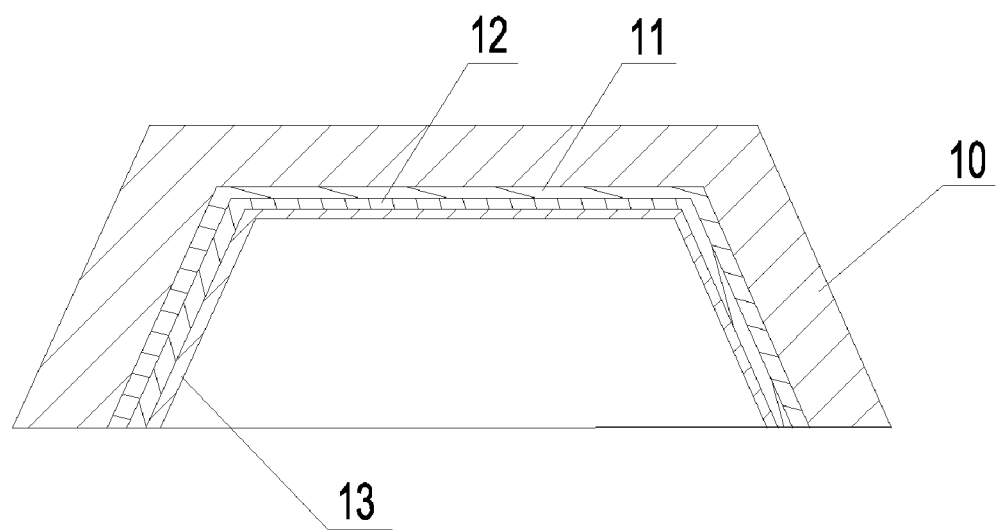
FIG. 2 is the full structure schematic diagram of the product provided for the embodiment 1 of the invention.

Embodiment 1:

See FIG. 2. The embodiment relates to a method for forming patterns by vacuum coating, which includes the following steps:

(1) prepare and clean a glass body, which is in form of a cup, a dish or other forms. It is a cup in this embodiment;

(11) coat a layer of electroplating oil on the glass body;

(2) pre-treat a part of an internal surface of the glass body where a pattern is to be formed thereon;

(21) prepare a membrane with a hollowed-out pattern and adhere the membrane on the glass body;

(22) spray a wax layer evenly on the membrane and the surface of the glass body to cover the hollowed-out pattern;

(23) remove the membrane;

(3) perform vacuum coating to the glass body and form a coating layer on the surface of the glass body;

(4) hollow out the pattern to be formed by removing the wax layer sprayed on the glass body by heating and thereby forming the pattern;

(41) clean the glass body and coat a coloured protective layer outside the coating layer, which can obtain the effect of colour and luster of imitated gold, beryl, sapphire, etc., by changing the colour of the coating layer.

The said coating layer is an aluminum plating layer with a thickness of 0.001-0.01 mm. While processing, the aluminum for coating is high purity aluminum filament. In the embodiment, the thickness of the aluminum plating layer is about 0.001-0.005 mm on average.

Figure 1:
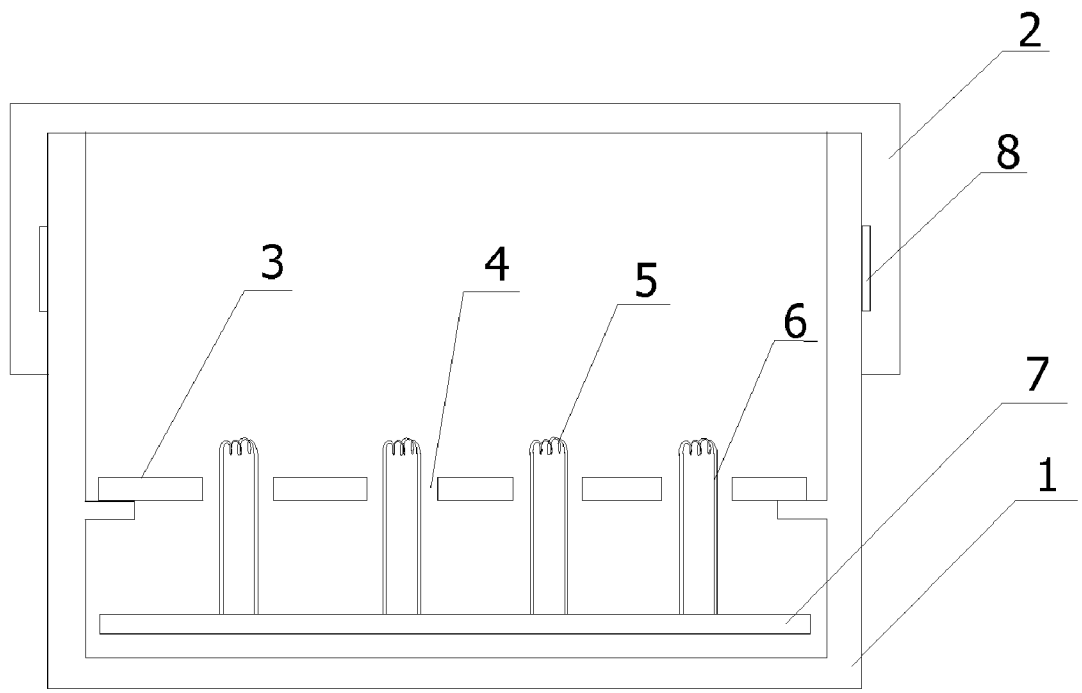
FIG. 1 is the full structure schematic diagram of the device provided for the embodiment 1 of the invention.

See FIG. 1. A special device for implementing the method for forming patterns by vacuum coating, including an upper shell 2 and a lower shell 1 which hold each other together. The lower shell 1 is provided with a socket and a level support plate 3 in the middle, on which a plurality of through-holes 4 are disposed; an insulating circuit board 7 is provided on the bottom of the lower shell 1, where the upper end face of the insulating circuit board is disposed with a plurality of electric heating plates for coating 6 at positions corresponding with those of the through-holes respectively, and every electric heating plate for coating 6 passes through the through-holes 4 and extends upwards; on the upper part of the electroplating heating plates 6 is a tungsten filament 5 and both ends are connected to one pole of the power supply respectively and then connected to the said socket after parallel connection. There's also a placket on the upper shell 2 or the lower shell 1 to draw vacuum; also a sealing ring 8 is disposed on the joint surface between the upper shell 2 and the lower shell 1.

When machining, the high purity aluminum filament is placed on all tungsten filaments 5, then the glass bodies which have undergone pre-treatment are converted and covered on all the electroplating heating plates for coating 6 one by one, then close the upper shell 2 and the lower shell 1 and draw vacuum. Electrify all tungsten filaments 5 transiently and simultaneously to heat and sublime or vaporize the aluminum filament to gas, the gas then fills in the glass body and contacts the internal surface and coagulates to be the coating layer; cut the power supply and remove the glass body. The device can enhance efficiency and coherence of production greatly to maintain stable quality.

See FIG. 2. A product manufactured by the method for forming patterns by vacuum coating includes a glass body 10. It is characterized in that it is a candle holder. The glass body 10 is a polyhedron, whose internal surface is a curved and rough side and on which there's one coating layer 12 with hollowed-out pattern; the internal surface is disposed with the electroplating layer 11, the coating layer 12 (including the hollowed-out pattern) and the protective layer 13 in turn from inside to outside. Among them, the coating layer 12 is an aluminum plating layer with a thickness of 0.001~0.01 mm; the protective layer 13 is a coating of colored paint or other organic compound.

Embodiment 2:

This embodiment is to provide another method for forming patterns by vacuum coating. It comprises the following steps:

(1) prepare and clean a glass body 10;

(2) pre-treat a part of an internal surface of the glass body 10 where a pattern is to be formed thereon;

(21) program and input basic pattern information in a computer;

(22) convert the basic pattern information into vector information;

(23) calculate and adjust the basic pattern information according to curvature and roughness of the glass body;

(3) position the glass body which is of cup-shaped to face downwards, and perform vacuum coating to the glass body 10 and form a coating layer 12 on the surface of the glass body 10; the coating layer 12 is an aluminum plating layer with a thickness of 0.001~0.01 mm in this embodiment;

(4) set an extinction object or coating in the glass body 10 before step (4) to stop a laser beam which penetrates the internal side of the glass body 10 from projecting towards other parts;

According to the information gained from step (23), control a laser etching device connected to the computer to enable the laser beam to penetrate the glass body 10 and scan the internal surface of the glass body, then melt or gasify the coating to expose the glass body 10 again, and pattern is formed.

The object or coating set before step (4) is paper roll, scroll, cloth roll, glue stopper, cork, etc. The extinction object or coating is, for example, wax layer or oil layer, etc.

In this embodiment, the extinction object or coating is a wax layer painted on the glass body 10.

The glass body is a transparent cup-shaped polyhedron, whose internal surface is the part where the pattern is to be formed thereon. In other embodiments, the glass body may be of other shapes.

The structure of a special device for implementing the method for forming patterns by vacuum coating in this embodiment is identical with that of the first embodiment. They have basically the same process of work. The difference is that the forming of pattern on the coating layer of the glass body is by means of laser etching technology after the coating is removed from the glass body.

The structure of a product manufactured using the method for forming patterns by vacuum coating is basically identical with that of the first embodiment. The difference is that the thickness of the plating aluminum layer 12 is 0.001-0.01 mm on average. In other embodiments, the thickness may be 0.001-0.01.

According to the above mentioned embodiment, any method for forming patterns by vacuum coating with the same or similar technical features as in the above embodiments is within the scope of protection of this invention.

I claim:

1. A method for forming patterns by vacuum coating, characterized in that it includes the following steps:
   (1) prepare and clean a glass body;
   (2) pre-treat a part of a surface of the glass body where a pattern is to be formed thereon;
   (21) prepare a membrane with a hollowed-out pattern and adhere the membrane on the glass body;
   (22) spray a wax layer evenly on the membrane and the surface of the glass body to cover the hollowed-out pattern;
   (23) remove the membrane;
   (3) perform vacuum coating to the glass body and form a coating layer on the surface of the glass body; the coating layer is an aluminum plating layer with a thickness of 0.001-0.01 mm;
   (4) hollow out the pattern to be formed by removing the wax layer sprayed on the glass body by heating and thereby forming the pattern.

2. The method as set forth in claim 1, characterized in that said step (1) also includes the following steps:
   (11) coat a layer of electroplating oil on the glass body;
   the said step (4) also includes the following steps:
   (41) clean the glass body and coat a protective layer outside the coating layer.

3. The method for forming patterns by vacuum coating, characterized in that it includes the following steps:
   (1) prepare and clean a glass body;
   (2) pre-treat a part of a surface of the glass body where a pattern is to be formed thereon;

(21) program and input basic pattern information in a computer;

(22) convert the basic pattern information into vector information;

(23) calculate and adjust the basic pattern information according to curvature and roughness of the glass body;

(3) perform vacuum coating to the glass body and form a coating layer on the surface of the glass body; the coating layer is an aluminum plating layer with a thickness of 0.001-0.01 mm;

(4) according to the information gained from step (23), control a laser etching device connected to the computer to enable a laser beam to penetrate the glass body and scan the surface of the glass body, then melt or gasify the coating of the scanned surface to expose the glass body, and pattern is formed; said step (4) also includes following step:

set an object or coating in the glass body before said step (4) to interdict the laser beam which penetrates the surface of the glass body from projecting towards other parts.

4. The method as set forth in claim 3, characterized in that the object or coating to interdict the laser beam includes extinction object or coating.

5. The method as set forth in claim 3, characterized in that the object or coating is a wax layer painted on the glass body.

6. The method as set forth in claim 1 or 3, characterized in that the glass body is a transparent cup-shaped polyhedron, and the surface of the glass body where the pattern is to be formed thereon is an internal surface of the cup-shaped polyhedron;

said step (3) is to position the glass body to face downward and form the coating layer on its internal surface, the coating layer is an aluminum plating layer with a thickness of 0.001-0.01 mm.

\* \* \* \* \*